(12) United States Patent
Kobayakawa

(10) Patent No.: US 7,364,947 B2
(45) Date of Patent: Apr. 29, 2008

(54) METHOD FOR CUTTING LEAD TERMINAL OF PACKAGE TYPE ELECTRONIC COMPONENT

(75) Inventor: Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 293 days.

(21) Appl. No.: 10/531,355

(22) PCT Filed: Oct. 17, 2003

(86) PCT No.: PCT/JP03/13287

§ 371 (c)(1),
(2), (4) Date: Apr. 15, 2005

(87) PCT Pub. No.: WO2004/036647

PCT Pub. Date: Apr. 29, 2004

(65) Prior Publication Data

US 2006/0141672 A1    Jun. 29, 2006

(30) Foreign Application Priority Data

Oct. 17, 2002    (JP) .............................. 2002-302984

(51) Int. Cl.
*H01L 33/495* (2006.01)
*H01L 21/00* (2006.01)
(52) U.S. Cl. ...................... 438/111; 438/106; 438/123; 257/666; 257/669; 257/673
(58) Field of Classification Search ................ None
See application file for complete search history.

(56) References Cited

U.S. PATENT DOCUMENTS

| | | | |
|---|---|---|---|
| 4,862,246 A * | 8/1989 | Masuda et al. ............. | 257/666 |
| 5,391,439 A | 2/1995 | Tomita et al. | |
| 5,633,205 A * | 5/1997 | Tsuchiya et al. ............... | 29/827 |
| 6,040,623 A * | 3/2000 | Chan et al. .................. | 257/692 |
| 6,355,502 B1 * | 3/2002 | Kang et al. .................. | 438/110 |
| 6,399,415 B1 * | 6/2002 | Bayan et al. ................ | 438/106 |
| 6,400,004 B1 * | 6/2002 | Fan et al. .................... | 257/666 |
| 6,452,255 B1 * | 9/2002 | Bayan et al. ................ | 257/666 |
| 6,483,178 B1 * | 11/2002 | Chuang ...................... | 257/672 |
| 6,498,099 B1 * | 12/2002 | McLellan et al. ........... | 438/689 |
| 6,812,552 B2 * | 11/2004 | Islam et al. .................. | 257/666 |
| 2001/0042904 A1 * | 11/2001 | Ikenaga et al. ............. | 257/666 |
| 2001/0052643 A1 | 12/2001 | Sugihara et al. | |
| 2003/0006492 A1 * | 1/2003 | Ogasawara et al. ......... | 257/684 |

FOREIGN PATENT DOCUMENTS

JP    401220466    * 9/1989

(Continued)

*Primary Examiner*—Carl Whitehead, Jr.
*Assistant Examiner*—James M Mitchell
(74) *Attorney, Agent, or Firm*—Hamre, Schumann, Mueller & Larson, P.C.

(57) ABSTRACT

In an electronic component comprising a semiconductor chip packaged in a molded part from which the lead terminals of the semiconductor chip project, a main cutting notch is formed on the obverse surface of each lead terminal before molding the molded part while leaving unnotched portions adjoining both ends of the main notch. Then, each lead terminal is cut at the main notch after molding the molded part, thereby making fewer and smaller cutting burrs occurring at the cut faces.

6 Claims, 6 Drawing Sheets

FOREIGN PATENT DOCUMENTS

| | | |
|---|---|---|
| JP | 3-248551 | 11/1991 |
| JP | 4-134852 | 5/1992 |
| JP | 4-171854 | 6/1992 |
| JP | 5-1246 | 1/1993 |
| JP | 5-055436 | 3/1993 |
| JP | 6-216298 | 8/1994 |

* cited by examiner

METHOD FOR CUTTING LEAD TERMINAL OF PACKAGE TYPE ELECTRONIC COMPONENT

TECHNICAL FIELD

The present invention relates to a method of cutting a portion of a lead terminal for a package type electronic component which comprises an element such as a semiconductor chip packaged in a molded part made of a synthetic resin with the lead terminal projecting out of the molded part.

BACKGROUND ART

JP-A 3-248551 representing prior art technology provides an electronic component obtained, as shown in FIGS. 1 and 2, by placing a semiconductor chip 4' on the upper surface of a tip end of one lead terminal 2' of at least a pair of left and right lead terminals 2', 3', electrically connecting the semiconductor chip 4' and the upper surface of a tip end of the other lead terminal 3' by wire bonding with a fine metal wire 5', and packaging the portions of the semiconductor chip 4' and metal wire 5' with a molded part 6' from a thermosetting synthetic resin so that the lead terminals 2', 3' project outwardly along a bottom surface 6a' of the molded part 6'.

Further, when the package type electronic component 1 of the above-described configuration is manufactured by the conventional process, a well-known method is employed by which, as shown in FIG. 3, a lead frame A' punched out from a thin metal sheet is used, the aforementioned pair of lead terminals 2', 3' are formed inwardly so as to face each other in the lead frame A', the tip ends of the two lead terminals 2', 3' are stepwise bent, then the semiconductor chip 4' is placed on the upper surface of the tip end of one lead terminal 2', the semiconductor chip 4' and the upper surface of the distant end of the other lead terminal 3' are electrically connected by wire bonding with a fine metal wire 5', then a finished product of the electronic component 1' is obtained by molding the molded part 6' for packaging the entire structure, and each electronic component 1' in the lead frame A' is then cut and separated form the lead frame A' by cutting with a fixed punch C1' and a punch C2' movable in the vertical direction at the positions of cutting lines B1', B2' in each lead terminal 2', 3' as shown in FIG. 4.

The above-described package-type electronic component 1' is cut and separated from the lead frame A', as described hereinabove, by cutting with the fixed punch C1' and punch C2' movable in the vertical direction at the positions at cutting lines B1', B2' in each lead terminal 2', 3'. As a result, on the cutting faces 2e', 3e' of the lead terminals 2', 3', as shown in FIG. 1, cutting burrs D1, D2 produced by cutting are formed so as to project downwardly from rear surfaces 2b', 3b' of the front surfaces (upper surfaces) 2a', 3a' and rear surfaces (lower surfaces) 2b', 3b' in the lead terminals 2', 3', and those cutting burrs cause the following inconveniences. Thus, the cutting burrs D1, D2 hinder bending of the lead terminals 2', 3', hinder soldering of the lead terminals 2', 3' to a circuit board or the like, or degrade heat dissipation from the electronic component 1 to the circuit board or the like because the lead terminals 2', 3' are lifted by the cutting burrs D1, D2 from the circuit board.

In addition, when cutting is conducted with the fixed punch C1' and punch C2' movable in the vertical direction, a large cutting force is necessary and strong impacts act upon the lead terminals 2', 3'. As a result, the lead terminals 2', 3' are separated from the molded part 6' and tight sealing thereof with the molded part 6' is degraded.

The above-described problems of inhibited soldering and degraded heat dissipation become especially significant in the case of electronic component 1' of the above-described type wherein the lead terminals 2', 3' projecting from the molded part 6'extend outwardly along the bottom surface 6a' of the molded part 6'.

Accordingly, as described in Japanese Patent Application Laid-open No. 5-55436 representing prior art technology close to the present invention, as shown in FIG. 5, notches 7', 8' for cutting are recess indented, before cutting the lead terminals 2', 3', in the lower surfaces 2b', 3b' of the lead terminals 2', 3', for example, by punching with a punch, so that the notches 7', 8' reach the longitudinal side surfaces 2c', 2d', 3c', 3d' on the left and right sides in the lead terminals 2', 3', that is, cross the entire width of the lead terminals 2', 3', and the lead terminals 2', 3' are cut with the fixed punch C1' and punch C2' movable in the vertical direction along the cutting lines B1', B2' at the positions of those notches 7', 8', thereby preventing the cutting burrs D1, D2 originating during cutting from projecting downward from the lower surfaces 2b', 3b' of the lead terminals 2', 3' and reducing the cutting force required for cutting.

However, the following problems are associated with the method by which the notches 7', 8' for cutting are recess indented in the lower surfaces 2b, 3b' of the lead terminals 2', 3' so as to cross the entire width of the lead terminals 2', 3' and the lead terminals 2', 3' are cut at the positions of the notches 7', 8'.

Thus, when indenting the notches 7', 8' for cutting is conducted after molding the molded part 6', strong impacts occurring when the notches 7', 8' are molded act upon the lead terminals 2', 3' and the lead terminals 2', 3' are separated from the molded part 6', thereby creating a high risk of degrading the tight sealing of the lead terminals 2', 3' with the molded part 6'.

On the other hand, the advantage of indenting the notches 7', 8' for cutting before molding the molded part 6' is in that tight sealing of the lead terminals 2', 3' with the molded part 6' can be ensured and a solder plated layer can be formed on the inner surface of the notches 7', 8', but the drawback of this method is that when the molded part 6' is formed, part of the molten synthetic resin penetrates into the notches 7', 8' and is cured therein, thereby producing burrs of synthetic resin in a packed state inside the notches 7', 8'.

When the lead terminals 2', 3' are cut at the positions of notches 7', 8' in this state, damage of the cutting knives is increased, a smooth cutting face cannot be obtained, and impacts acting upon the lead terminals during cutting are not reduced. As a result, a difficult deburring operation has to be implemented with respect to the lead terminals 2', 3' after molding the molded part 6' and before cutting the lead terminals 2', 3' to remove the burrs of synthetic resin that penetrated into the notches 7', 8' and was cured therein. This troublesome operation greatly increases the cost. Another problem is that the deburring is sometimes impossible in small semiconductor devices, that is, with thin lead terminals.

It is a technological object of the present invention to provide a cutting method that is free from the above-described problems.

DISCLOSURE OF THE INVENTION

A first aspect of the present invention provides a method of cutting a lead terminal for a package type electronic component which comprises an element such as a semiconductor chip packaged in a molded part made of a synthetic resin with the lead terminal for said element projecting out of the molded part. The method comprises the steps of: indenting a main cutting notch on at least one of obverse and reverse surfaces of the lead terminal in a step before molding the molded part while leaving an unnotched portion between the main notch and each longitudinal side surface of the lead terminal, and then cutting the lead terminal at the main notch in a step after molding the molded part.

In this way, the main cutting notch is formed on the lead terminal before molding the molded part while the unnotched portion is left between the main notch and each longitudinal side surface of the lead terminal, followed by molding the molded part. Thus, the presence of the main notch reduces impacts affecting the lead terminal at the time of cutting the lead terminal, thereby reliably ensuring tight seal for the lead terminal relative to the molded part. Further, the unnotched portion adjoining each end of the main notch reliably prevents the molten synthetic resin from entering into the main cutting notch of the lead terminal, when the molded part is molded.

Further, because the lead terminal is cut at the the main cutting notch, the cutting burrs occurring at the cutting face are restricted to the unnotched portion at each end of the main cutting notch, so that the number and size of the cutting burrs can be reduced. Further, because impacts affecting the lead terminal at the time of cutting the lead terminals can be reduced, tight seal for the lead terminal relative to the molded part becomes reliable.

Thus, with the first aspect of the present invention, it is possible to make fewer and smaller cutting burrs occurring at the cut face when the lead terminal is cut, and therefore a step of conducting deburring of the synthetic resin with respect to the lead terminal after the molded part is molded can be omitted, cost can be thereby reduced, and tight seal for the lead terminal with the molded part can be ensured.

A second aspect of the present invention provides a method of cutting a lead terminal for a package type electronic component which comprises an element such as a semiconductor chip packaged in a molded part made of a synthetic resin with the lead terminal for said element projecting out of the molded part. The method comprises the steps of: indenting a main cutting notch on at least one of obverse and reverse surfaces of the lead terminal in a step before molding the molded part while leaving an unnotched portion between the main notch and each longitudinal side surface of the lead terminal, then indenting a cutting sub-notch at the unnotched portion in a step after molding the molded part, and then cutting the lead terminal at the main notch and the sub-notch.

With this second aspect, in addition to the method steps of the first aspect, the cutting sub-notch is indented at the unnotched portion adjoining each end of the main notch after molding the molded part, and then the lead terminal is cut at the main notch and the sub-notch. Thus, the cutting burrs occurring at the cut faces project into the sub-notch, so that the cutting burrs do not project beyond one surface of the lead terminal.

In this case, the sub-notch at the unnotched portion is indented after the molded part is molded, but because the cutting sub-notch is indented in the very narrow unnotched portion with a width obtained by subtracting the width of the main notch from the width of the lead terminal, the influences of impacts on the lead terminal is much lower than that produced when the notch is indented across the entire lead terminal, as with the conventional technology. As a result, loss of hermeticity in the lead terminal sealed with respect to the molded part can be reduced to a minimum.

According to a third aspect of the present invention, in the method of the above-described first aspect or second aspect, the lead terminal extends outwardly along a bottom surface of the molded part, and the one surface of the lead terminal on which the main notch or the combination of the main notch and the sub-notch is provided is located on the side of the bottom surface of the molded part.

With this third aspect, the advantages obtained in accordance with the first aspect or second aspect are obtainable with respect to electronic components of the type where each lead terminal extends outwardly along the bottom surface of the molded part, as shown in FIG. 1.

According to the fourth aspect of the present invention, the method of the first aspect further comprises a step of implementing a metal plating treatment with respect to the lead terminal at least between the step of indenting the main notch and the step of cutting the lead terminal.

According to the fifth aspect of the present invention, the method of the second aspect further comprises a step of implementing a metal plating treatment with respect to the lead terminal at least between the step of indenting the sub-notch and the step of cutting the lead terminal.

With the fourth or fifth aspects, a metal plated layer can be formed on the portion of the cut face in the lead terminal that is on the inner surface of the main notch, or the metal plated layer can be formed on the portion at the inner surface of the main notch, and additionally a metal plated layer can be also formed on the portion of the inner surface of the sub-notch. Therefore, solderability at the lead terminals can be reliably improved without causing a significant increase in cost.

Further, according to the sixth aspect of the present invention, the method of the above-described second aspect further comprises a step of implementing a first metal plating treatment with respect to with respect to the lead terminal at least between the step of indenting the main notch and the step of cutting the lead terminal, and a step of implementing a second metal plating treatment with respect to the lead terminal at least between the step of indenting the sub-notch and the step of cutting the lead terminal. As a result, in addition to the metal plated layer formed on the portion of the inner surface of the sub-notch by the second metal plating treatment, the thickness of the metal plated layer on the portion of the inner surface of the main notch can be increased by conducting both the first metal plating treatment and the second metal plating treatment. Therefore, solderability can be further improved.

BEST MODE FOR CARRYING OUT THE INVENTION

Figure 1:
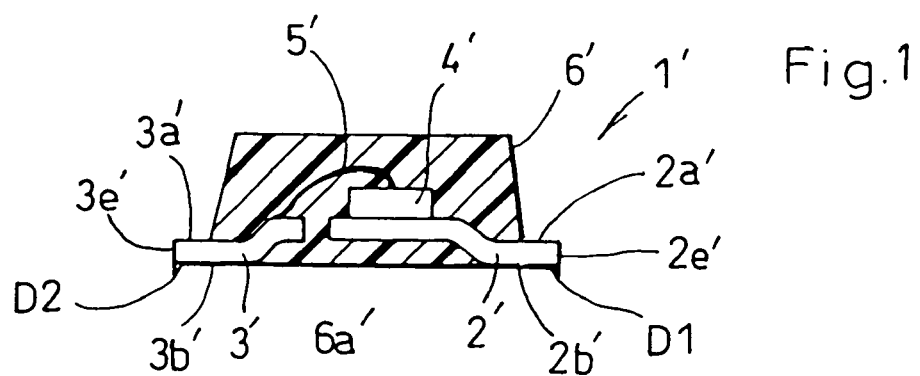
FIG. 1 is a front view with a longitudinal section illustrating the conventional electronic component.
Figure 2:
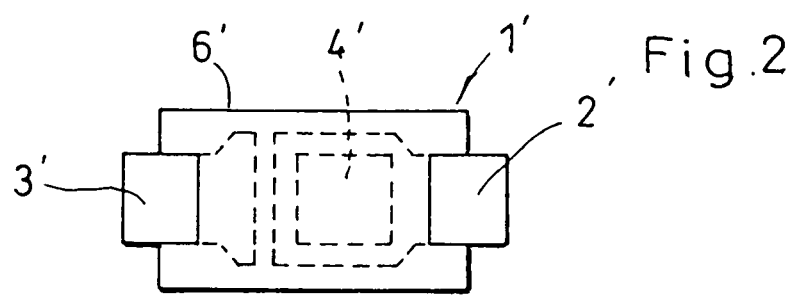
FIG. 2 is a bottom view of the component shown in FIG. 1.
Figure 3:
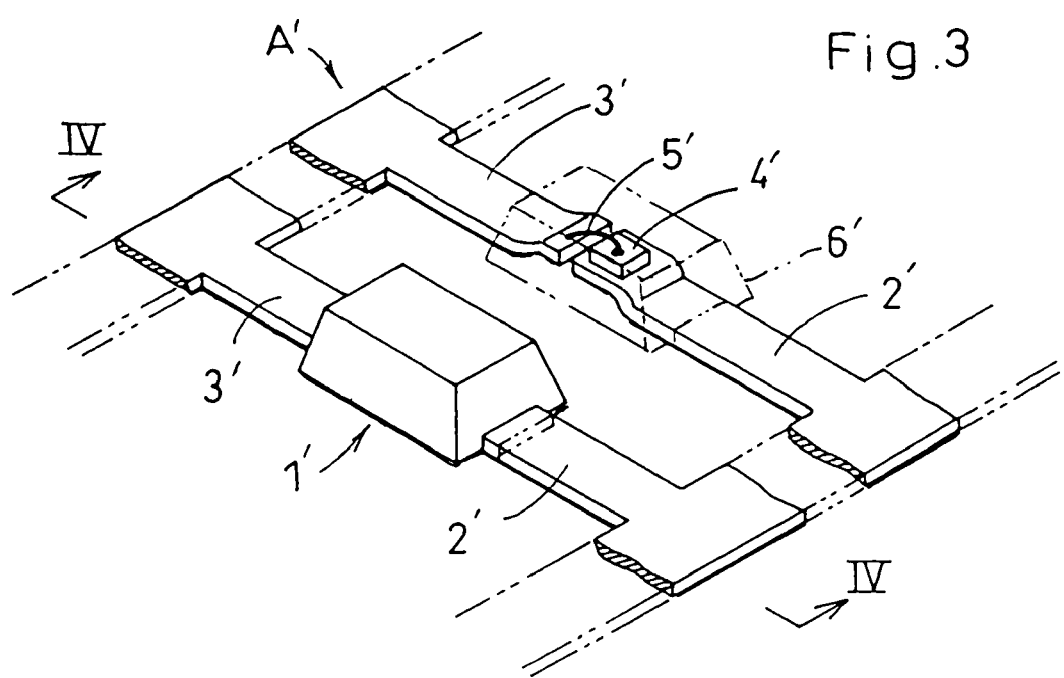
FIG. 3 is a perspective view illustrating a lead frame used in the manufacture of the electronic component.
Figure 4:
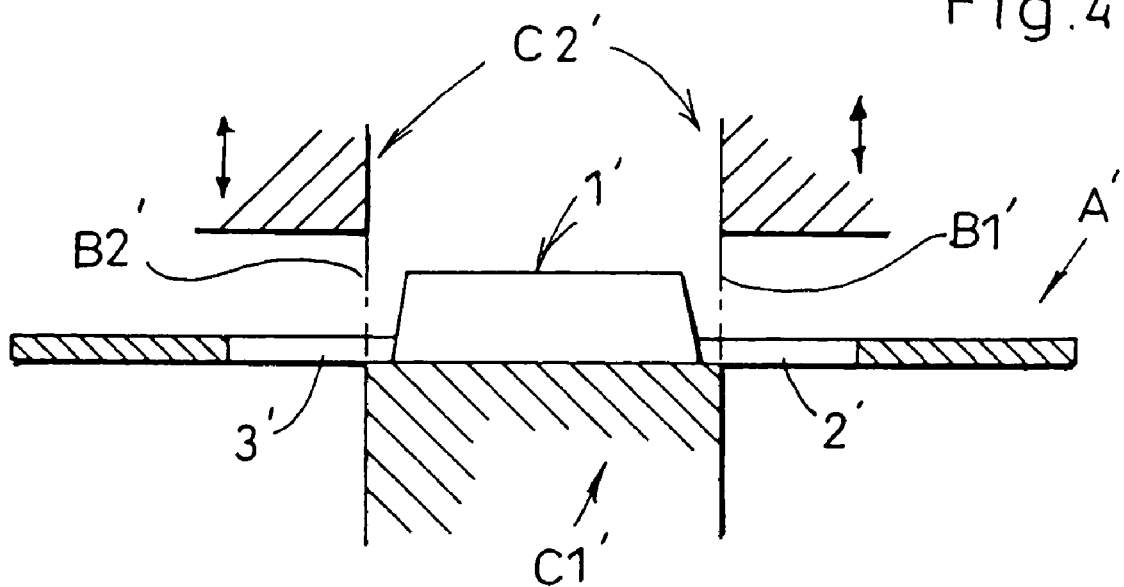
FIG. 4 illustrates a state of cutting the electronic component from the lead frame.
Figure 5:
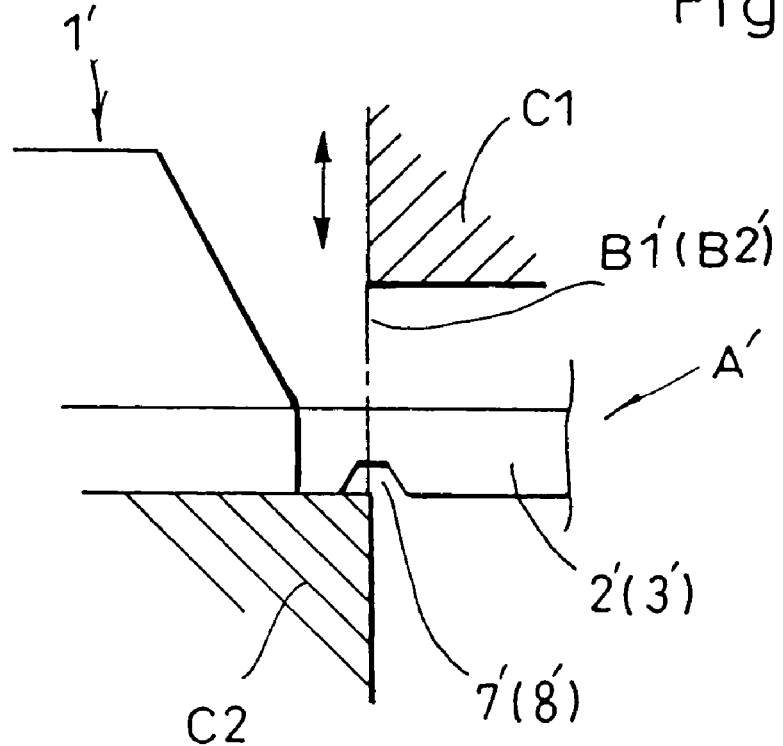
FIG. 5 is an enlarged drawing illustrating the main part shown in FIG. 4.

The embodiments of the present invention will be described below with reference to the appended drawings.

FIGS. 6 through 13 illustrate the first embodiment.

In the figures, the reference numerals 2, 3 stand for lead terminals integrally formed in a metal sheet so as to face each other in a lead frame A.

Figure 6:
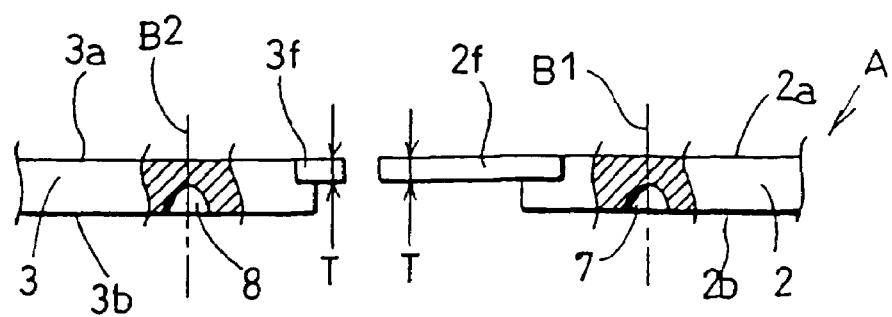
FIG. 6 illustrates the state in which a main notch for cutting was indented in the lead frame in accordance with the present invention.
Figure 7:
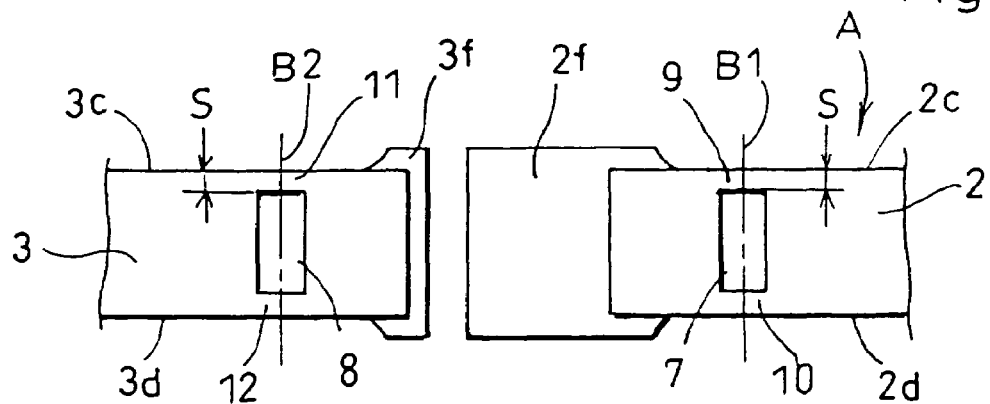
FIG. 7 is a bottom view of the state shown in FIG. 6.

As shown in FIGS. 6 and 7, the tip end of each lead terminal 2, 3 in the lead frame A is plastically deformed into a thin-walled plate portion 2f, 3f of a small thickness T. Each lead terminal 2, 3 has an obverse surface (upper surface) 2a, 3a and a reverse surface (lower surface) 2b, 3b, and a main notch 7, 8 for cutting is impressed in the reverse surface (lower surface) 2b, 3b by punching with a punch (not shown) at the position of a cutting line B1, B2 in the respective lead terminal 2, 3 for example.

When each main notch 7, 8 is impressed, the indenting is so conducted as to leave an unnotched section 9, 10, 11, 12 of a comparatively small size S between the main notch 7, 8 arid a respective longitudinal side surface 2c, 2d, 3c, 3d of the respective lead terminal 2, 3.

Then, at least a portion of each lead terminal 2, 3 of the lead frame A projecting from a molded part 6 (to be described later) is subjected to base plating for forming a plated nickel underlayer for example, and is thereafter subjected to finish plating for forming a plated overlayer of a metal, such as tin or solder, which is excellent in solderability over the plated nickel layer.

Figure 8:
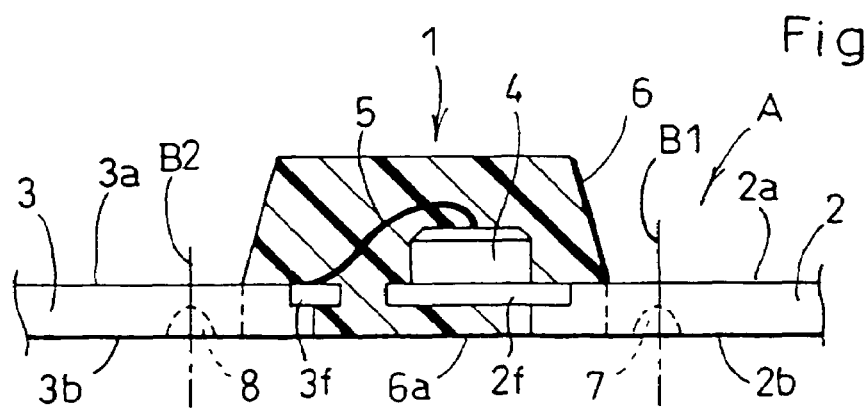
FIG. 8 illustrates a state in which a semiconductor chip was placed on the lead frame and packaged in a molded part in accordance with the present invention.

Then, as shown in FIG. 8, a semiconductor chip 4 is mounted on the upper surface of the thin-walled plate portion 2f at the tip end of the lead terminal 2, which is a selected one of the two lead terminals 2, 3. The semiconductor chip 4 is electrically connected to the upper surface of the thin-walled plate portion 3f at the tip end of the other lead terminal 3 by wire bonding using a fine metal wire 5. Then, a molded part 6 for packaging the semiconductor chip 4 and the metal wire 5 is formed by molding using a thermosetting synthetic resin such as an epoxy resin for example, with the two lead terminals 2, 3 extending outwardly along the bottom surface (lower surface) 6a of the molded part 6, thereby obtaining an electronic component 1 as a finished product.

In this case, because the unnotched portions 9, 10, 11, 12 are present at both ends of the main notches 7, 8 in the lower surfaces 2b, 3b of the two lead terminals 2, 3, the molten synthetic resin can be reliably prevented by the unnotched portions 9, 10, 11, 12 from entering and curing in the main notches 7, 8 when the molded part 6 is formed.

Figure 9:
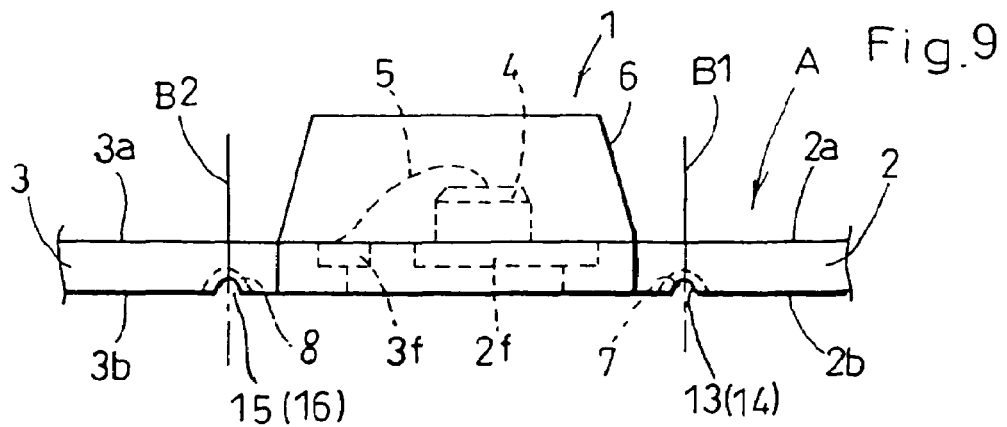
FIG. 9 illustrates a state in which a sub-notch for cutting was indented in the lead frame in accordance with the present invention.
Figure 10:
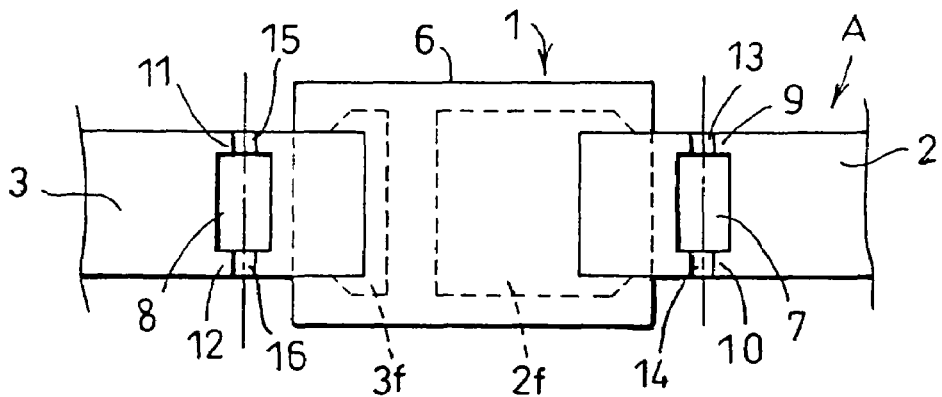
FIG. 10 is a bottom view of the state shown in FIG. 9.

Then, as shown in FIGS. 9 and 10, sub-notches 13, 14, 15, 16 for cutting are impressed, for example, by punching with a punch (not shown) in the unnotched portions 9, 10, 11, 12 in the lower surfaces 2b, 3b of the two lead terminal 2, 3.

Because the sub-notches 13, 14, 15, 16 are impressed at the unnotched portions 9, 10, 11, 12 of the comparatively small size S, such impressing of the sub-notches 13, 14, 15, 16 requires far weaker impacts against the lead terminals 2, 3 than conventionally required for impressing notches across the entire width of the lead terminals.

Figure 11:
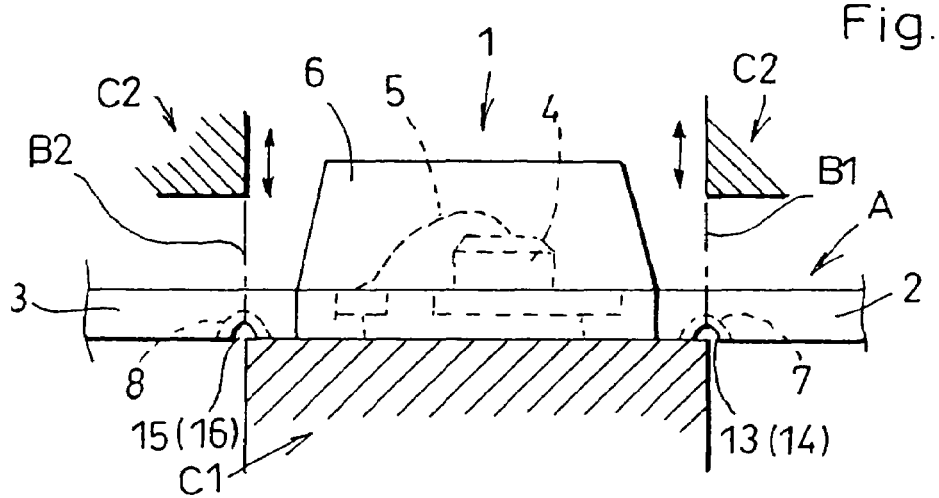
FIG. 11 illustrates a state of cutting the electronic component from the lead frame in accordance with the present invention.

Then, as shown in FIG. 11, the electronic component 1 on the lead frame A is separated from the lead frame A by cutting along the cutting lines B1, B2 at the main notches 7, 8 and sub-notches 13, 14, 15, 16 of each lead terminal 2, 3 using a fixed punch C1 and a vertically movable punch C2.

Figure 12:
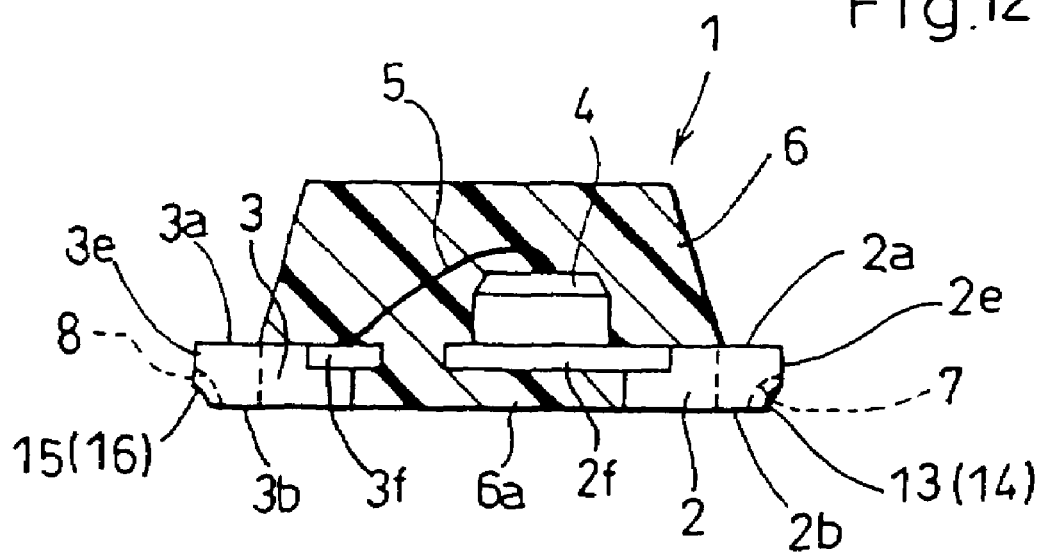
FIG. 12 is a front view with a longitudinal section illustrating the electronic component in accordance with the present invention.
Figure 13:
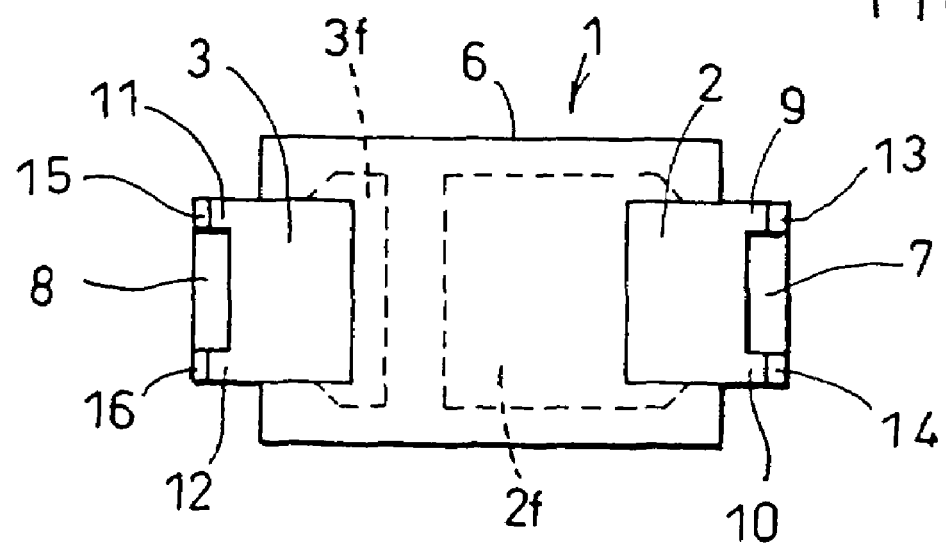
FIG. 13 is a bottom view of the component shown in FIG. 12.

As shown in FIGS. 12 and 13, the electronic component 1 thus obtained has a structure in which each lead terminal 2, 3 of the semiconductor chip 4 projects outwardly along the bottom surface 6a of the synthetic resin molded part 6 packaging the semiconductor chip 4.

The lead terminals 2, 3 of the electronic component 1 having such a structure are obtained by cutting at the main notches 7, 8 and sub-notches 13, 14, 15, 16 impressed in the lower surfaces 2b, 3b of the lead terminals. As a result, even when cutting burrs occur at cutting faces 2e, 3e, those cutting burrs project only inside the main notches 7, 8 and sub-notches 13, 14, 15, 16 and do not project beyond the lower surfaces 2b, 3b of the lead terminals 2, 3.

Therefore, when the electronic component 1 of such a structure is soldered to a circuit board or the like, the lead terminals 2, 3 can be brought into intimate contact with electrodes in the circuit board or the like. As a result, reliable soldering can be conducted and heat dissipation from the electronic component 1 to the circuit board or the like can be ensured.

Further, by the metal plating treatment comprising base plating with nickel in the step prior to forming the molded part 6 and finish plating with tin or a solder, a metal plated layer composed of a nickel plated layer as an underlayer and a metal plated layer excellent in solderability, such as tin or a solder, on top of the nickel plate layer is formed in the cutting faces 2e, 3e of the lead terminals 2, 3 on the portions on the inner surfaces of the main notches 7, 8.

On the other hand, on the portions of the cutting faces 2e, 3e on the inner surfaces of the sub-notches 13, 14, 15, 16, a metal plated layer is formed in an extended condition to a thickness less than the above-described layer by indenting the sub-notches 13, 14, 15, 16 by a process following the above-described metal plating treatment.

As a result, when soldering is conducted to a circuit board or the like, soldering is also performed to the cutting faces 2e, 3e in the lead terminals 2, 3 and solderability can be reliably improved.

In this case, the metal plating treatment comprising the base plating processing with nickel and finish plating processing with tin or a solder is conducted twice as a first metal plating treatment carried out before the molded part 6 is molded and second metal plating treatment carried out after the sub-notches 13, 14, 15, 16 have been indented. As a result, a thick metal plated layer composed of a nickel plated layer as a base and a metal plated layer excellent in solderability, such as tin or a solder, on top of the nickel plated layer can be reliably formed inside the sub-notches 13, 14, 15, 16 of the cutting faces 2e, 3e in the lead terminals 2, 3. On the other hand, the thickness of the metal plated layer in the main notches 7, 8 of the cutting faces 2e, 3e can be further increased in metal plated processing conducted twice.

In this case, the metal plated layer obtained by the aforementioned first metal plating treatment implemented before the sub-notches have been indented remains in a thin extended state, as described hereinabove, inside the sub-notches 13, 14, 15, 16 in the lead terminals 2, 3. As a result, the second metal plating treatment may comprise only plating processing with a metal excellent in solderability, such as tin or a solder, and the nickel plating processing can be omitted from the second metal plating treatment, thereby making it possible to reduce the cost.

Figure 14:
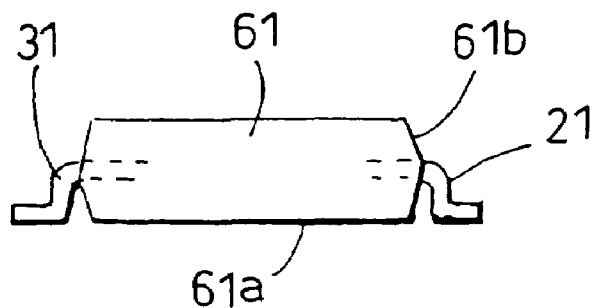
FIG. 14 illustrates an example of the electronic component employing the present invention.
Figure 15:
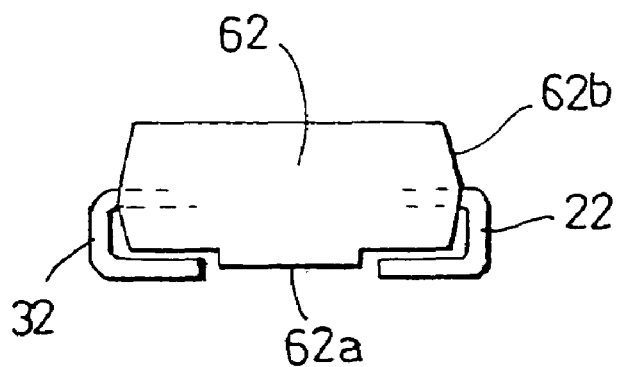
FIG. 15 illustrates another example of the electronic component employing the present invention.
Figure 16:
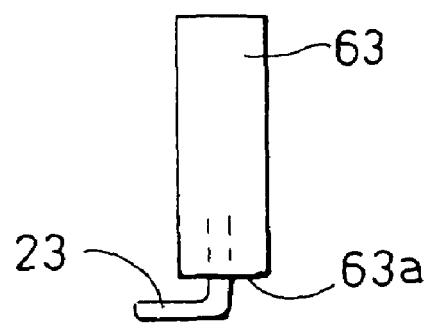
FIG. 16 illustrates yet another example of the electronic component employing the present invention.

Further, the present invention is not limited to electronic components of a type such that lead terminals are arranged so as to extend outwardly along the bottom surface of the molded part, as in the above-described embodiment. Thus, it goes without saying that the present invention can be similarly applied to electronic components of a type such that a lead terminal 21 projecting from a side surface 61b of a molded part 61 is formed by bending outwardly along a bottom surface 61a of the molded part 61 as shown in FIG. 14, electronic components of a type such that a lead terminal 22 projecting from a side surface 62b of a molded part 62 is formed by bending inwardly along a bottom surface 62a of the molded part 62 as shown in FIG. 15, or electronic components of a type such that a lead terminal 23 extending downwardly from a bottom surface 63a of a molded part 63 is formed by bending sidewise as shown in FIG. 16.

Moreover, the present invention is not limited to electronic components of a two-terminal type that comprise two lead terminals and can be similarly applied to electronic components comprising three or more lead terminals, such as transistors, and electronic components in which semiconductor chips and lead terminals are connected by wire bonding with fine metal wires.

The invention claimed is:

1. A method of cutting a lead terminal for a package type electronic component which comprises an element such as a semiconductor chip packaged in a molded part made of a synthetic resin with the lead terminal for said element projecting out of the molded part, the method comprising the steps of:

indenting a main cutting notch on at least one of obverse and reverse surfaces of the lead terminal in a step before molding the molded part while leaving an unnotched portion between the main notch and each longitudinal side surface of the lead terminal, then indenting a cutting sub-notch at the unnotched portion in a step after molding the molded part, and then cutting the lead terminal at the main notch and the sub-notch.

2. The lead terminal cutting method for a package type electronic component according to claim 1, wherein the lead terminal extends outwardly along a bottom surface of the molded part, the one surface of the lead terminal on which the main notch or the combination of the main notch and the sub-notch is provided is located on the side of the bottom surface of the molded part.

3. The lead terminal cutting method for a package type electronic component according to claim 1, further comprising a step of implementing a metal plating treatment with respect to the lead terminal at least between the step of indenting the sub-notch and the step of cutting the lead terminal.

4. The lead terminal cutting method for a package type electronic component according to claim 3, wherein the metal plating treatment includes plating with nickel as an underlayer and plating with a metal having good solderability over the underlayer.

5. The lead terminal cutting method for a package type electronic component according to claim 1, further comprising a step of implementing a first metal plating treatment with respect to with respect to the lead terminal at least between the step of indenting the main notch and the step of cutting the lead terminal, and a step of implementing a second metal plating treatment with respect to the lead terminal at least between the step of indenting the sub-notch and the step of cutting the lead terminal.

6. The lead terminal cutting method for a package type electronic component according to claim 5, wherein the first metal plating treatment includes plating with nickel as an underlayer followed by plating with a metal having good solderability over the underlayer, and the second plating processing including plating with a metal having solderability.

* * * * *